United States Patent
Carroll

[19]

[11] Patent Number: 6,043,669
[45] Date of Patent: Mar. 28, 2000

[54] WIRELESS TEST FIXTURE

[76] Inventor: Keith C. Carroll, 6 Berney Drive, Caledon East, Ontario, Canada, L0N 1E0

[21] Appl. No.: 08/947,753

[22] Filed: Oct. 9, 1997

[30] Foreign Application Priority Data

Oct. 7, 1997 [CA] Canada .................................. 2217591

[51] Int. Cl.⁷ .................................................... G01R 1/73
[52] U.S. Cl. .......................... 324/761; 324/757; 324/754
[58] Field of Search ..................................... 324/754, 757, 324/761, 149, 72.5

[56] References Cited

U.S. PATENT DOCUMENTS

| | | | |
|---|---|---|---|
| 4,352,061 | 9/1982 | Matrone | 324/158 |
| 4,870,354 | 9/1989 | Davaut | 324/757 |
| 5,157,325 | 10/1992 | Murphy | 324/158 |
| 5,252,916 | 10/1993 | Swart | 324/158 |
| 5,389,885 | 2/1995 | Swart | 324/761 |
| 5,456,616 | 10/1995 | Fuerst et al. | 439/620 |
| 5,506,510 | 4/1996 | Blumenau | 324/754 |

Primary Examiner—Josie Ballato
Assistant Examiner—Minh Tang

[57] ABSTRACT

A printed circuit board test fixture includes a plurality of flexible printed circuits having circuit traces on one side for interconnecting the test probe pin assemblies of the fixture with the interface connector pins for the interface panel of the fixture. The flexible circuits are folded in the fixture housing to provide spaced apart non-contacting layers of first contact areas for connection to the test probe pin assemblies and spaced apart non-contacting layers of second contact areas for connection to the interface connector pins. The layers of flexible circuit of each contact area receive the test probe pin assemblies and interface connector pins which secure the layers of flexible circuit in the fixture. The test probe pin assemblies and the interface connector pins make electrical and mechanical engagement with terminal apertures in the layers of flexible circuit. The layers further include through holes allowing the test probe pin assemblies and interface connector pins to pass through layers of the flexible circuit without making electrical contact with these layers. This permits circuit traces to be used on each of the layers of flexible circuit for selected test probe pin assembly and interface connector pin connected pairs.

22 Claims, 6 Drawing Sheets

WIRELESS TEST FIXTURE

FIELD OF THE INVENTION

The present invention relates to electrical testing fixtures used for printed circuit boards and, in particular, it relates to wireless test fixture of the bed of nails type.

BACKGROUND OF THE INVENTION

Electrical test fixtures are used to test the functionality of a printed circuit board by making electrical interconnection between nodal points in the printed circuit board and a test system. The test system, or test electronics analyzer, typically comprises a computer programmed to send test signals through the test fixture to the printed circuit board to test the operability of circuit components on the printed circuit board.

A standard fixture employed for this testing is a "bed of nails" fixture. A bed of nails fixture comprises a large number of nail-like test probes having tips that make electrical contact with the nodal points of the circuit to be tested. The test probes are typically spring loaded pins inserted in receptacles that pass through and are secured relative to a supporting plate. The printed circuit is placed on top of the test probes and sealed with a gasket. A vacuum is applied through the test fixture to draw the printed circuit board down onto the spring loaded test probes to ensure good electrical contact. The vacuum is maintained until the testing is complete after which another printed circuit board is placed onto the test fixture for testing. A bed of nails type of fixture is disclosed in U.S. Pat. No. 4,352,061 issued Sep. 28, 1997 to Fairchild Camera and Instrument.

The test probes are inserted into the receptacles which extend below the lower side of the well plate. The lower end of the receptacle typically has a square wire wrap post. Other types terminal post are crimp, solder cup and round. A wire is wrapped about the receptacle post and extends in a point-to-point wiring connection to an interface connector pin inserted into a fixture interface panel. The fixture interface panel is adapted to be connected to an interface receiver of the test electronics analyzer. The point-to-point wiring of each receptacle post to a corresponding interface connector pin involves manually wire wrapping one wire or a twisted pair of wires between each of the receptacle post and interface connector pin. The extra wire in the twisted pair is connected to ground and is used to limit noise effects from the electromagnetic interference (EMI) induced by running test signals through other wires in the test fixture during the test analysis. With the miniaturization of electrical components the number of test points in a circuit has risen significantly making point-to-point wiring for each fixture a labor intensive operation.

The number of nodal contact points to be tested on the printed circuit board can range upwards to 8000 or more nodal test points. For printed circuit boards requiring in the order of 3000 to 5000 or less nodal test points it is economical practice at the time of filing the present application to use point-to-point wiring between each test probe and a corresponding contact probe. Automation of this process is not economical because each printed circuit board requires a unique design configuration. As the number of nodal points rises above 3000 to 5000 points, the wiring of the closely adjacent test pins becomes more tedious and solutions relating to the use of a wireless test fixture have been contemplated.

Wireless test fixtures solutions using rigid interface boards to interconnect the receptacle posts to the interface pin connectors of the fixture interface panel are now available. These wireless test fixtures have improved manufacturing processing times and reduced effects from EMI when compared to point-to-point wiring in the electrical test fixtures. The rigid interface board is formed with a large number of pads or openings in which the receptacle posts are inserted and soldered. In some cases, two sided probes are used to connect with the rigid interface boards. Electrically conductive traces run between the test probes and the connector terminals through this multilayer interface board. With these interface boards, the wire traces are also run to the ends of the boards and electrical connections are taken from a pin connection terminal directly to the fixture interface panel via cabling. The problem with such rigid interface boards is that the construction of the interface boards resembles that of a printed circuit board requiring capital installation costs. Since the multilayer interface board is typically a one off board for the test fixture, the price of such wireless fixtures is relatively high. Another problem occurs when a nodal test point location is changed or added during the development of the test fixture, or an engineering change is implemented. This may occur when the test fixture is being tested before shipment or later when minor engineering board changes are required. When boards are used, the addition or modification of a nodal contact point may result in a change in circuit topography requiring a new board. Also, the soldering of the test probes and connectors to the interface board is time consuming and can cause solder bridging (short circuits).

A wireless test fixture is disclosed in U.S. Pat. No. 5,157,325 where the use of rigid interface boards with test probes and interface connector pins that abuttingly contact electrical trace contact pads of the interface board. While no soldering is required, this interface board still requires circuit traces to be run on both sides of the board, and in some case on both sides of layers of a multilayer board. This board is subject to the same disadvantages noted above relating to printed circuit boards.

The introduction of a flexible printed circuit to act as the interface device in a wireless test fixture is disclosed in U.S. Pat. No. 5,252,916 issued Oct. 12, 1993 to Everett Charles Technologies Inc. The flexible circuit is attached to the well plate and the interface receiver panel by adhesive so that the flexible circuit does not move relative to these rigid substrates. This patent teaches the use of nail like test probes without springs and a diaphragm secured across a portion of the bottom layer of the flexible circuit substrate and the probe pins. The probes have mushroom shaped heads against which the diaphragm is moved when pressurized to bring the pins into good electrical contact with the nodal points of the printed circuit board. The patent is concerned with the use of a diaphragm to force the test probe pins into contact with the printed circuit board. To ensure electrical contact between the probes and flexible circuit traces, contact eyelet's are fastened to the flexible circuit over an aligned aperture in the flexible circuit. The probes extend through the eyelet's to each of the circuit traces at the interface pin connector. The fastening of thousands of eyelet's to the flexible circuit is a laborious and expensive task.

There is a need for a wireless test fixture that can be manufactured without additional component costs, in a timely manner and still have the wire integrity associated with wire wrapping.

SUMMARY OF THE INVENTION

The present invention relates to a printed circuit board test fixture that includes the use of a flexible printed circuit, and in particular a plurality of flexible printed circuit layers having circuit traces on one side for interconnecting test probe contact pin assemblies with the interface connector pins for the interface panel of the fixture. The flexible circuits are folded in the fixture housing to provide first contact areas for connection to the test probe pin assemblies and second contact areas for connection to the fixture interface connector pins. The layers of flexible circuit of each contact area are spaced apart from each other in non-contacting relation with both the test probe pin assemblies or interface connector pins solely holding the layers of flexible circuit in the fixture. The test probe pin assemblies and the interface connector pins make electrical and mechanical engagement with terminal apertures in each of the layers of flexible circuit that are coated with an electrically conductive material. The layers further include through holes allowing the test probe pin assemblies and interface connector pins to pass through layers of the flexible circuit without making electrical contact with these layers. This permits circuit traces to be used on each of the layers of flexible circuit for selected test probe pin and interface connector pin connected pairs.

By test probe contact pin assemblies it is meant a contact pin assembly capable of engaging the nodal points on the circuit board to be tested and extending into the fixture for interconnection with the flexible circuit. The test probe contact pin assemblies each preferably includes a spring loaded test probe pin inserted into the top end of a hollow receptacle pin and a lower post terminal pin extending from the lower end of the hollow receptacle pin. The lower post terminal pin is preferably a round shaped post. Alternatively, other shapes for the receptacle post may be used. It should be understood that the present invention need not be limited to the pin assembly described and that any suitable pin assembly construction that provides electrical contact between the printed circuit to be tested and flexible circuit would fall within the realm of the present invention.

The present invention has advantage by using flexible circuit layers eliminates the tedious operation of point-to-point wiring. Further, the flexible circuit, particularly made from a polyimide substrate, lends itself to having circuit traces being formed by etching paths on the substrate by use of lasers, as described in more detail in my Canadian Application Ser. No. 2,189,291 filed Oct. 31, 1996 entitled Method of Making a Multilevel Polyimide Stencil, and subsequently coating the etched trace with a conductive ink. The flexible circuit can be modified or additional layers added as the need arises due to changes in the test circuitry. It should be understood that this allows the flexible circuitry to be used in place of wiring. A further advantage resides in the assembly of the flexible circuits within the test fixture. The flexible circuits can be assembled by pushing each layer over the ends of the pins. There is no need to secure the contact areas of the flexible circuits to each other and to the rigid plates or interface panel surface of the test fixture.

To secure the contact areas of the layers of flexible printed circuit to each of the sets of test probe pin assemblies and interface connector pins preferably the flexible circuit substrate comprises a polyimide material and each contact aperture includes a pattern cut into polyimide material that leaves resilient flaps in the aperture adapted to bend and to grasp these pin terminals. Alternatively, each contact aperture includes a rim of conductive adhesive surrounding the contact aperture for adhering in electrical and mechanical engagement the contact pin terminal to the flexible circuit.

While the location of the circuit traces on one side of each of the layers of flexible circuit reduces interference due to EMI in relation to wire wrap technology, the present invention contemplates the preferred use of a shielding layer inter-spaced between layers of flexible circuit. The shielding layer includes a material such as, for example, a polyimide having a copper foil laminated to one side opposite with clearance through holes allowing receptacle posts and interface pins to pass without contacting the copper foil.

In accordance with a broad aspect of the present invention, there is provided a printed circuit board test fixture comprising a well plate having a plurality of first holes passing therethrough. The fixture includes a plurality of test probe pin assemblies passing through and secured relative to the first holes of the well plate. The test probe pin assemblies are adapted to make electrical contact with test points of a printed circuit board. The fixture has an interface panel for receiving a plurality of interface connector pins adapted to be connected to a test electronics analyzer for sending test signals to the test fixture. At least one flexible printed circuit layer is provided for interconnecting the test probe pin assemblies with the interface connector pins. The flexible printed circuit includes a substrate having circuit traces on at least one side thereof running between first contact apertures located in a first contact area and second contact apertures located in a second contact area. The first contact area of the flexible printed circuit is positioned adjacent the well plate and the test probe pin assemblies extend through the contact apertures of the first contact area to secure the first contact area of the flexible circuit relative to the well plate. The flexible circuit is folded to position the second contact area adjacent the lower interface panel and the interface connector pins extend through the contact apertures of the second contact area to secure the second contact area relative to the interface panel.

In accordance with another aspect of the present invention there is provided a printed circuit board single plane test fixture comprising a well plate having a plurality of first holes passing therethrough. A plurality of test probe pin assemblies passes through and is secured relative to the first holes of the well plate. The test probe pin assemblies are adapted to make electrical contact with test points of a printed circuit board. A plurality of interface connector pins are secured relative to the well plate and extend through an interface alignment panel. The interface alignment panel are adapted to be connected to a test electronics analyzer for sending test signals to the test fixture. At least one flexible printed circuit layer for interconnecting the test probe pin assemblies with the interface connector pins. The flexible printed circuit includes a substrate having circuit traces on at least one side thereof running between first contact apertures for connection with the test probe pin assemblies to secure the substrate relative the well plate and second contact apertures for connection with the interface connector pins to secure the substrate relative to the first well plate and the interface alignment panel.

BRIEF DESCRIPTION OF THE DRAWINGS

A more complete understanding of the method and apparatus of the present invention may be obtained by reference to the following detailed description when taken in conjunction with the accompanying drawings wherein.

DETAILED DESCRIPTION OF EMBODIMENTS

Figure 1:
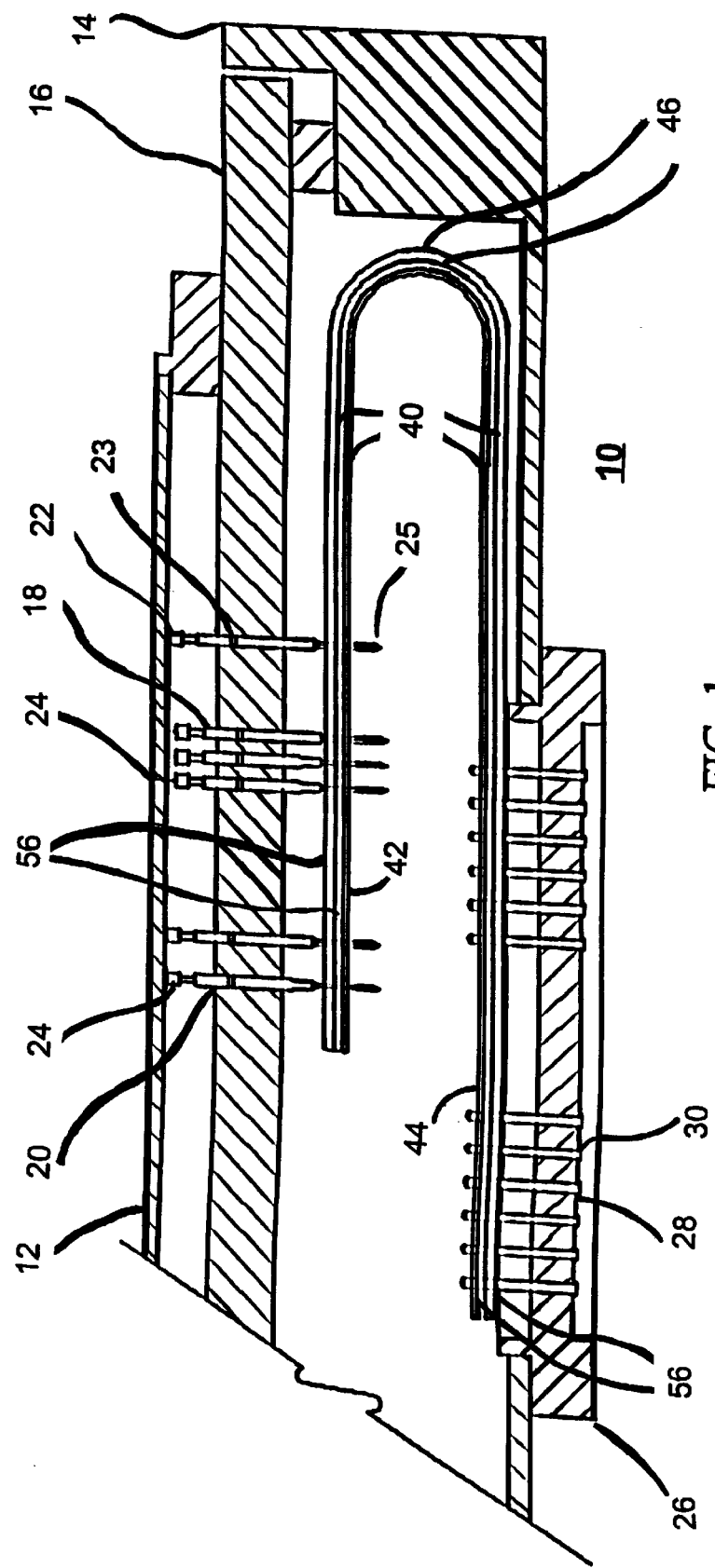
FIG. 1 is a sectional view of the wireless test fixture of the present invention.

Referring to FIG. 1 there is illustrated a test fixture 10 for testing a printed board 12. The test fixture includes a housing 14 in a box like shape with an open top. A well plate 16 closes the top of the housing 14. The well plate 16 is made of a sturdy, rigid electrical insulating material, such as G-10 fiberglass. The well plate has a plurality of holes 20 cut or drilled through the plate 16. The holes 20 are drilled in a pattern corresponding to the points to be tested on the printed circuit board 12.

Test probe pin assemblies 18 are secured relative to the plate 16 and pass through the holes 20. Assemblies 18 include spring loaded test probe pins 22 whose upper ends engage the nodal points 24 on the bottom surface of the printed circuit board. The test probe pins assemblies 18 are mounted in a center barrel of a receptacle 23 secured in the holes 20 of plate 16. The hollow receptacles 23 have a lower receptacle post terminal pin 25 extending downwardly therefrom.

Mounted to the bottom of the housing 14 is an interface panel 26 having a plurality of receiving interface holes 28. A plurality of interface connector pins 30 are inserted into the holes 28 of the interface panel 26. The interface panel 26 of the text fixture 10 is adapted to be mounted on the interface receiver of a test analyzer (not shown). The test analyzer includes a computer programmed with a suitable program to run test signals through the test fixture 10 to the printed circuit board 12 under test.

The number of test probe pin assemblies 18 and corresponding interface connector pins 30 may range in the order of 3,000 to 8,000 pins over an area of the circuit board under test. Thus, for illustrative purposes, the drawing shows a limited number of test probe pin assemblies 18 and connector pins 30.

Figure 2:
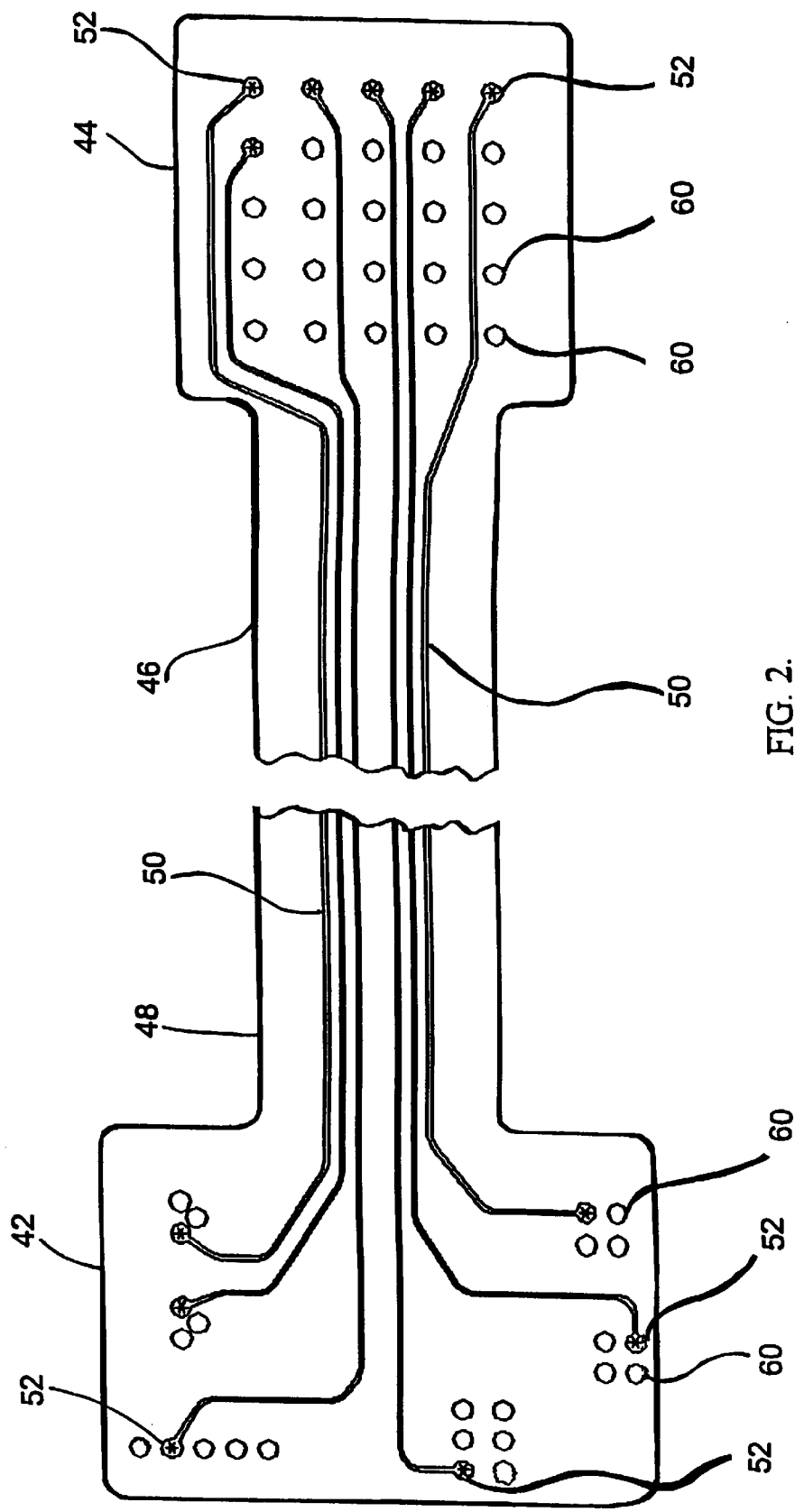
FIG. 2 is a plan view of one layer of a flexible printed circuit of the present invention.
Figure 5:
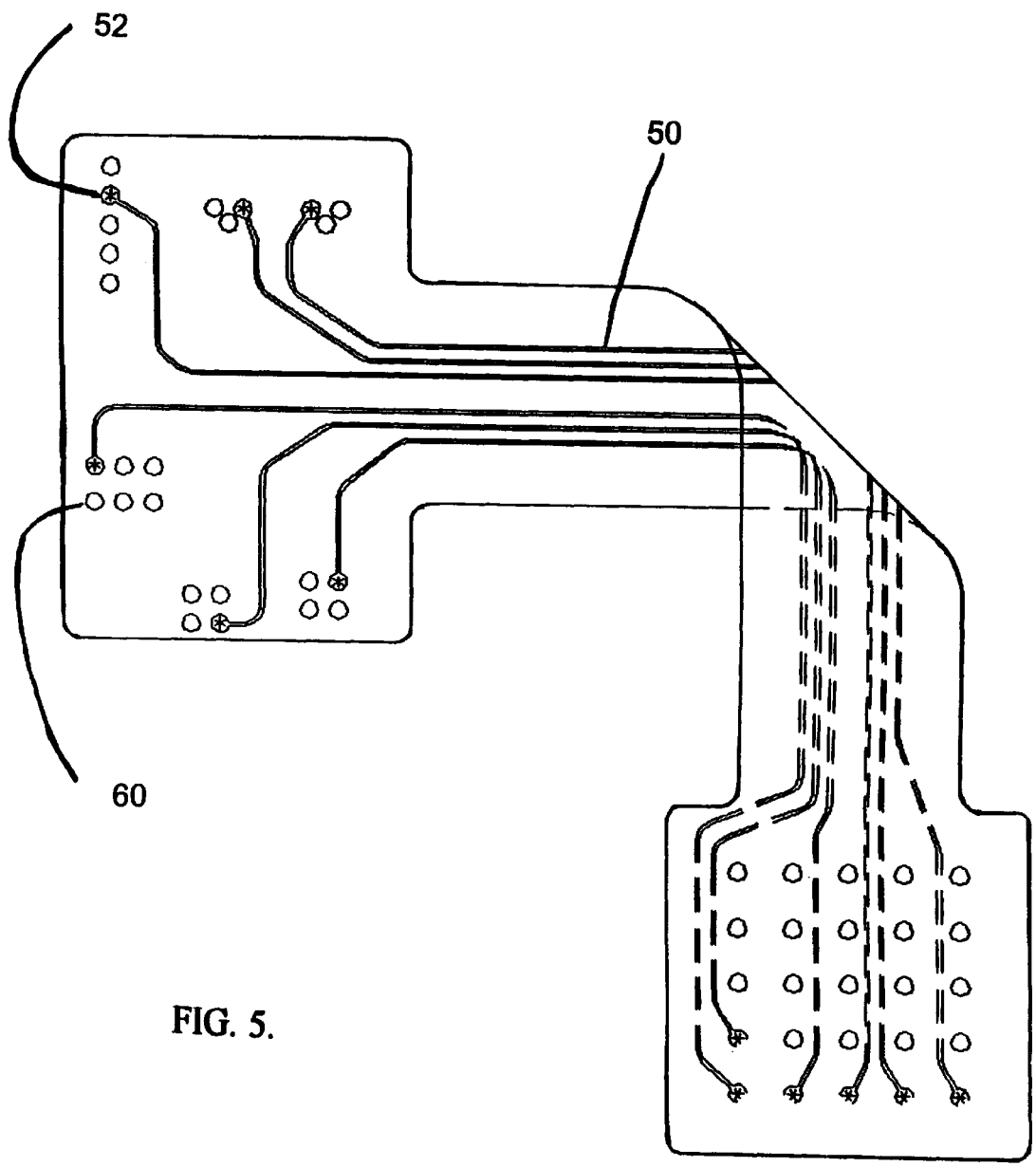
FIG. 5 is illustrates an alternative fold in the flexible circuit of the present invention; and, FIG. 6 is a sectional view of an embodiment showing a single plane wireless test fixture of the present invention.

The interconnection of the test probe pin assemblies 18 to the interface connector pins 30 as contemplated by the present invention involves the use of a plurality of layers of flexible printed circuits 40. While only two layers of circuits 40 are illustrated, some applications may require several layers. Referring to both FIGS. 1 and 2, the flexible circuit includes a first contact area 42 inter-spaced from a second contact area 44 by the central portion 46 of flexible circuit. In FIG. 1, the flexible circuits are shown to be folded one hundred and eighty degrees, however an alternate folding of the flex circuit is that shown in FIG. 5. Each layer of the flexible circuit comprises a substrate 48 carrying circuit traces 50. The circuit traces run over a first surface of the substrate 48 between first contact apertures 52 in the first contact area 42 and second contact apertures 54 in the second contact area 44. The contact areas 44 are shown as a circular terminal coated contact area having an asterisk pattern cut into the substrate. Each of the first contact areas of the respective layers of the flexible circuit 40 are spaced apart from each other as shown in FIG. 1. The layer closest to the well plate 16 is also shown spaced from this well plate 16. The circuit traces 50 of FIG. 2 run along the first surface 56 facing towards the well plate 16 and the connector terminal block 26.

Also located in each of the first and second contact areas of the flexible layers 40 are through holes 60 which are openings cut into the substrate 48 and are not coated with a conductive coating material.

Figure 3:
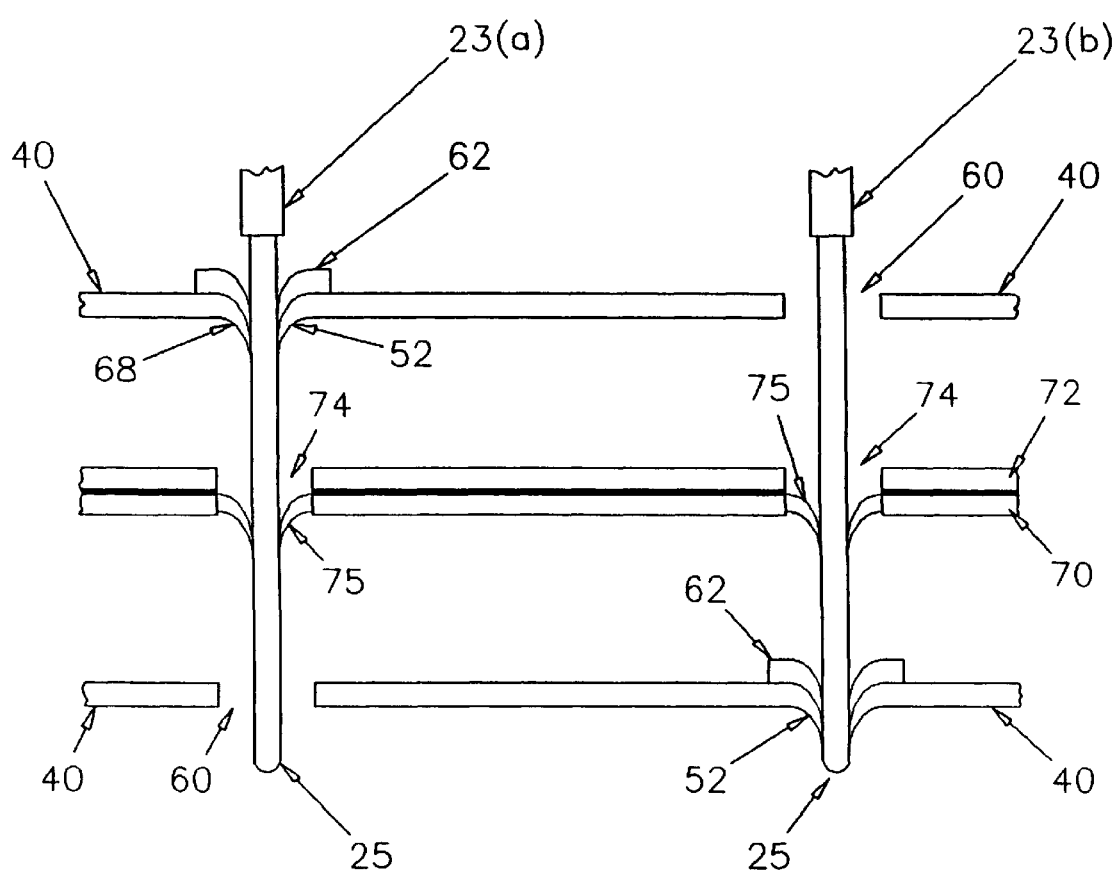
FIG. 3 is a perspective side view showing the connections made through one layer of the flexible printed circuit of the present invention.

The interconnection of the test probe pin assemblies 18 and the connector pins 30 with the corresponding first contact areas 42 and second contact areas 44 is best described with reference to FIG. 3. For the purposes of illustration, FIG. 3 shows electrical contact between the lower round receptacle posts 25 of the test probe pin assemblies 18 and selected layers of the flexible circuits 40. The receptacle posts 25 further pass through holes 60 and do not make electrical contact with the other flexible circuit layer 40. It should be understood that the interface connector pins 30 make similar engagements with the second contact areas of the flexible circuit.

A first test probe pin assembly 23a has its lower receptacle post 25 inserted through a contact aperture 52 in the upper most layer of flexible circuit 40 and the post 25 passes freely in non-contacting relation through the hole 60 in the lower layer of flexible circuit 40. The contact aperture 52 has a shape generally shown by the asterisk cut (FIG. 2) and is coated with a conductive coating material such as gold. The contacting aperture 52 is shown to include the gold plated portion or gold terminal at 62 with the substrate layer 40 below this. When the flexible substrate layer 40 is inserted over the posts 25, the folds or flaps 68 of aperture 52 bend and grasp the post 25. The resiliency of the substrate material 40 will cause the flaps 68 to force the gold plated terminal contact 62 into mechanical and electrical engagement with the post 25. This connection method is described in more detail in Applicant's corresponding Canadian patent application Ser. No. 2,213,590 filed Aug. 21, 1997 and entitled Flexible Circuit Connector and Method of Making Same (CWC-144). While one contact aperture configured in this manner may not be suitable for holding the substrate relative to the well plate 16 within the test fixture, it should be understood that for each layer of flexible substrate 40 there are probably hundreds of contact apertures between test probe pin assemblies 18 and contact apertures 52. Accordingly, this allows for each layer of the flexible circuits 40 to be held in place relative to the well plate 16 and also allows the flexible substrate or flexible circuit 40 to be held in place relative to the interface panel block 26 by a similar type of engagement with the interface connector pins 30.

Each of the upper layer and lower layer of flexible circuits illustrated in FIG. 3 include a through hole 60 which has a diameter slightly larger than the diameter of the round receptacle post 25. This allows the post 25 to pass through the layers of flexible circuit 40 without making electrical contact therewith.

The other receptacle 23(b) has post 25 passing through hole 60 of the upper layer of flexible circuit 40 and has post 25 engaging the lower flexible circuit 40 at aperture 52.

A shielding layer comprising a polyimide substrate 70 and a copper foil layer 72 is located between the two adjacent layers of flexible circuit 40. Layer 72 comprises a copper foil which is laminated to the surface of substrate 70. The substrate is non-conductive and includes asterisk type apertures 74 that have flaps similar to apertures 52 except that there is no conductive terminal portion. The flaps of apertures 74 grasp the posts 25 as the posts pass therethrough to hold the shielding layer relative to posts and the layers of the flexible circuit 40. The conductive foil 72 does not cover the apertures 74 and does not contact the posts 25.

Figure 4:
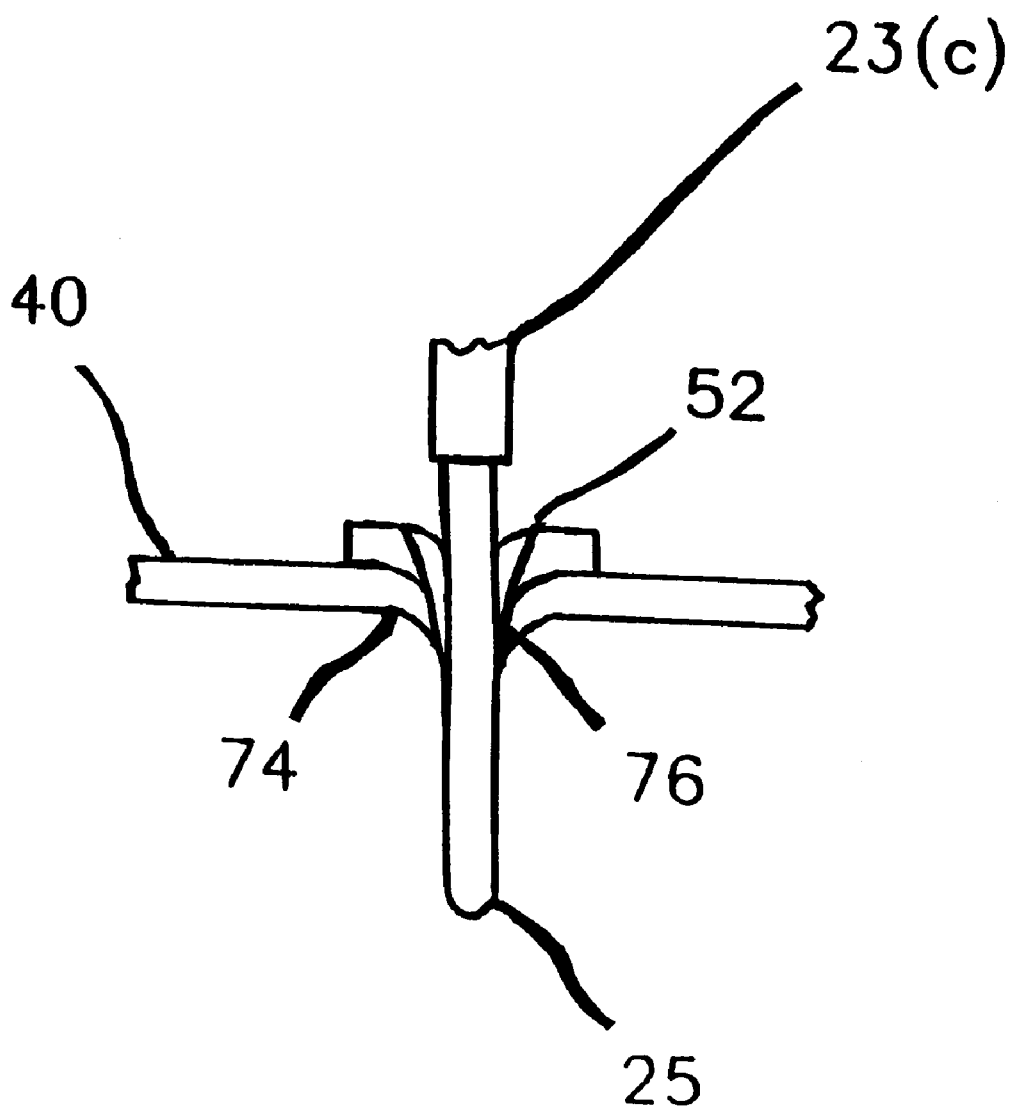
FIG. 4 is a perspective side view showing an alternative connection through one layer of the flexible printed circuit board of the present invention.

Referring to FIG. 4, there is shown an alternate method for connecting to the flexible circuit to posts 25. In this connection the contact aperture 52 of the layer of flexible circuit substrate 40 is chosen to be slightly less than the diameter of the post 25 so that minor deflection at the rim 74 of the aperture 52 occurs. Adjacent the plating for the aperture 62 is also included an adhesive electrically conductive material 76 which adheres the circuit traces on the substrate 40 to the post 25.

While the embodiment of post connection shown in FIG. 3 is the preferred connection, the substrate utilized by the present invention is preferably a flexible polyimide film having a thickness in the range of 0.002 to 0.12 inches. Suitable polyimide films currently sold on the market by Dupont under the Trade-marks Kapton® and Cirlex®. Kapton is used for a thickness below 0.007 inches and Cirlex is used for a thickness above 0.007 inches. The thickness of the polyimide film will be chosen proportional to the thickness of the test probe pin assemblies and the connector pins used in the present invention. With respect to FIG. 2, while asterisk patterns have been shown, it should be understood that any number of suitable flaps may be used in order to maintain the pins 62 in contact with the flexible circuit 40.

For the pin connection shown in FIG. 4 utilizing an adhesive, a polyester material such as Mylar may be used for the substrate 40.

The spacings between the flexible circuit 40 at the first contact areas 42 and also at the second contact areas 48 is determined by the thickness of shielding layer and the distances that the flaps of the contact aperture deflects down below the flexible substrate 40.

It should be understood that various alternative embodiments may be readily apparent to a man skilled in the art in view of the teachings as set out here and above.

Figure 6:
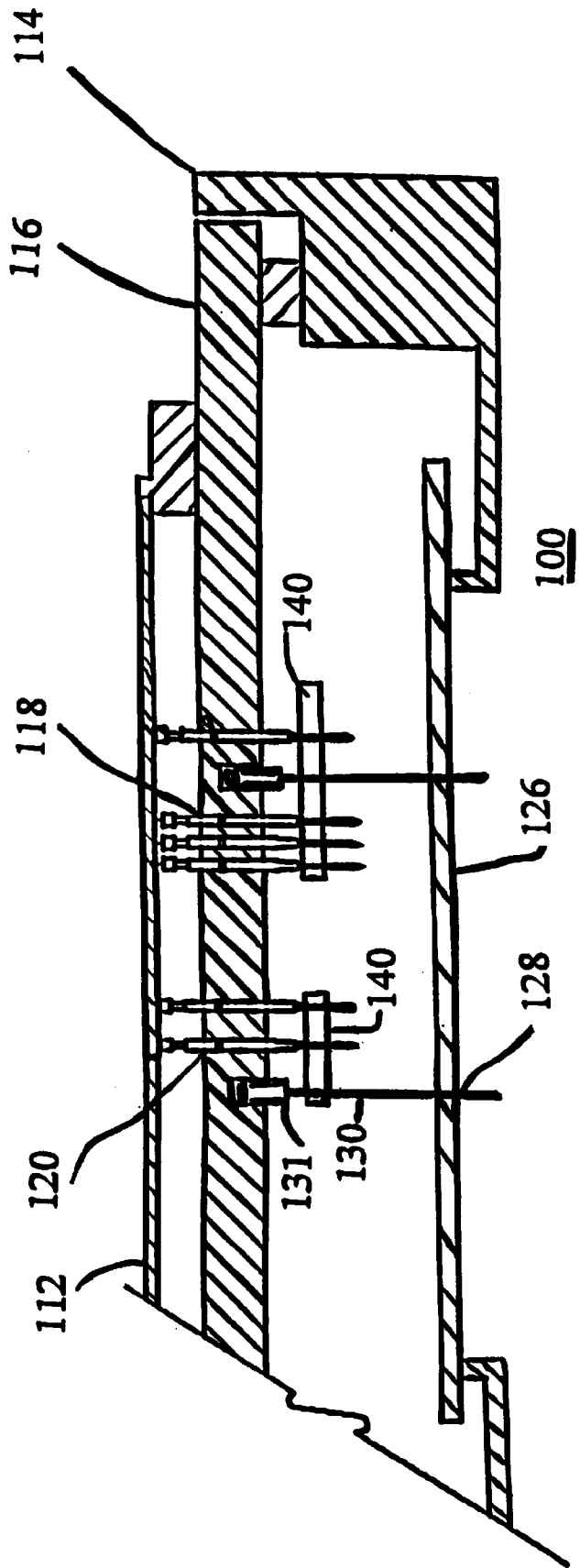

Referring to FIG. 6 there is illustrated a single plane test fixture 100 for testing a printed board 112. Single plane test fixtures are characterized by assembly of the test probe assemblies and the personality interface pins to the same well plate. Single plane test fixtures are known in the test fixture art such as, for example, those single plane test fixtures manufactured and sold by Hewlett Packard as model HP 3070. The test fixture includes a housing 114 in a box like shape with an open top. A well plate 116 closes the top of the housing 114. The well plate has a plurality of holes 120 cut or drilled through the plate 116.

Holes 120 are drilled in a pattern corresponding to the points to be tested on the printed circuit board 112. Test probe pin assemblies 118 are secured relative to the plate 116 and pass through the these holes 120. Assemblies 118 are similar to those described in FIG. 1.

Also mounted in a suspended form from the bottom of well plate 116 at holes 121 are personality interface connector pins 130. These pins 130 include a plastic sheath 131 attached to the bottom of the well plate 116 in an opening 121.

Mounted to the bottom of the housing 114 is an alignment interface panel 126 having a plurality of receiving interface holes 128. The plurality of personality interface connector pins 130 pass through holes 128 in the alignment interface panel 126. The holes 128 are usually provided with sloped surfaces to locate the pins 130 relative to the interface panel 126. The interface pins passing through the alignment interface panel are connected with an interface receiver of a test analyzer (not shown). The test analyzer includes a computer programmed with a suitable program to run test signals through the test fixture 100 to the printed circuit board 112 under test.

The interconnection of the test probe pin assemblies 118 to the personality interface connector pins 130 as contemplated by the present invention involves the use of at least one layer of flexible printed circuit 140. In some applications several layers may be used. The flexible circuits 140 are of similar construction to the flexible circuits 40 described above. Further the circuits 140 included through holes and contact apertures in the manner described in FIGS. 1 to 3. In the single plane test fixture, more than one discrete flexible circuit 140 is shown with the flexible circuit located on substantially the same plane. Alternatively, these discrete layers could be manufactured on one substrate as shown in FIG. 1. Alternatively, more than one layer vertically stacked layer could be used.

What is claimed is:

1. A printed circuit board test fixture comprising:

a well plate having a plurality of first holes passing therethrough;

a plurality of test probe pin assemblies passing through and secured relative to the first holes of the well plate the test probe pin assemblies being adapted to make electrical contact with test points of a printed circuit board;

an interface panel for receiving a plurality of interface connector pins, said interface panel being adapted to be connected to a test electronics analyzer for sending test signals to the test fixture;

a plurality of flexible printed circuit layers for interconnecting the test probe pin assemblies with the interface connector pins, each of the flexible printed circuit layers including:

a substrate having circuit traces on at least one side thereof running between first contact apertures located in a first contact area and second contact apertures located in a second contact area, the first contact area being positioned adjacent the well plate and the test probe pin assemblies extending through the first contact apertures of the first contact area to secure the first contact area relative to the well plate, and the substrate being folded to position the second contact area adjacent the interface panel and the interface connector pins extending through the second contact apertures of the second contact area to secure the second contact area relative to the interface panel; and, the plurality of flexible printed circuit layers being positioned, adjacent the first contact areas, in spaced apart non-contacting relation from each other and adjacent the first holes in the well plate such that the test probe pin assemblies make electrical contact with at least one of a selected one of the plurality of flexible circuit layers;

the plurality of flexible printed circuit layers being positioned, adjacent the second contact areas, in spaced apart non-contacting relation from each other and adjacent the interface connector pins of the interface panel such that the interface connector pins make electrical contact with at least one of a selected one of the plurality of flexible circuit layers;

the plurality of flexible printed circuit layers further including non-contact through holes in each of the first and second contact areas permitting test probe pin assemblies and interface connector pins to pass through selected other layers of the plurality of flexible printed circuit layers without making electrical contact therewith; and, the flexible printed circuit layers each having a thickness in the range of 0.002 to 0.012 inches.

2. The printed circuit board test fixture of claim 1 wherein the flexible printed circuit layers are secured within the test fixture solely by terminal pin connections to the test probe pin assemblies and by terminal pin connections to the interface pin connector pins.

3. The printed circuit board test fixture of claim 2 wherein each of the first and second contact apertures includes a rim of conductive adhesive for adhering in electrical and mechanical engagement respectively to the test probe pin assemblies and the interface connector pins.

4. The printed circuit board test fixture of claim 1 further including a layer of shielding material inter-spaced between adjacent layers of the flexible printed circuit layers.

5. The printed circuit board test fixture of claim 4 wherein the layer of shielding material comprises a polyimide layer having a copper foil laminated to one side thereof, and through holes passing through the copper foil and polyimide layer.

6. The printed circuit board test fixture of claim 1 wherein each of the flexible printed circuit layers comprises a polyimide material and each of the first and second contact apertures includes a pattern cut into polyimide material that leaves resilient flaps adapted to grasp respectively the contact probe pin assemblies and the interface connector pins.

7. A printed circuit board test fixture comprising:

a housing;

a well plate mounted to the housing said well plate having a plurality of first holes passing therethrough;

a plurality of test probe pin assemblies passing through and secured relative to the first holes of the well plate; the test probe pin assemblies each having an upper contact end extending above the well plate for making contact with a test point of a printed circuit board to be tested, and the test probe pin assemblies each having a lower contact end extending below the well plate;

an interface panel mounted to the housing;

a plurality of interface connector pins mounted relative to the interface panel, the interface connector pins having upper contact ends extending above the interface panel;

a plurality of spaced apart flexible printed circuit layers, each of the flexible printed circuit layers comprising a substrate layer having circuit traces on at least one side thereof running between first contact apertures located in a first contact area and second contact apertures located in a second contact area, the substrate layer further including first and second through holes respectively in each of the first and second contact areas, the first contact area of each substrate layer being positioned adjacent to and spaced from the well plate with the lower contact ends of the test probe pin assemblies extending through the first contact apertures and the first through holes of the first contact area where the first contact apertures are plated with an electrically conductive material to make electrical and mechanical engagement with the corresponding test probe pin assemblies, the mechanical engagement securing the first contact area of each substrate layer relative to the well plate, the substrate layer being folded to position the second contact area of each substrate layer adjacent to and spaced from the interface panel with the upper contact ends of the interface connector pins extending through the second contact apertures and second through holes of the second contact area where the second contact apertures in the second contact area of each substrate layer are plated with an electrically conductive material to make electrical and mechanical engagement with the corresponding interface connector pins, and the mechanical engagement securing the second contact area of each substrate layer relative to the interface panel; and the substrate layer having a thickness in the range of 0.002 to 0.012 inches.

8. The printed circuit board test fixture of claim 7 wherein the first contact areas of each of the flexible printed circuit layers are spaced apart in non-contacting relation from each other and wherein the second contact areas of each of the flexible printed circuit layers are spaced apart in non-contacting relation from each other, said flexible printed circuit layers each having circuit traces running on one side thereof that faces the well plate.

9. The printed circuit board test fixture of claim 7 wherein the flexible printed circuit layers are secured within the test fixture solely by terminal pin connections to the test probe pin assemblies and by terminal pin connections to the interface pin connector pins.

10. The printed circuit board test fixture of claim 9 wherein the substrate layer comprises a polyimide material and each of the first and second contact apertures includes a pattern cut into the polyimide material that leaves resilient flaps adapted to grasp respectively the test probe pin assemblies and the interface connector pins.

11. The printed circuit board test fixture of claim 9 wherein each of the first and second contact apertures includes a conductive adhesive rim for adhering in electrical and mechanical engagement respectively with the test probe pin assemblies and the interface connector pins.

12. The printed circuit board test fixture of claim 7 further including a layer of shielding material inter-spaced between adjacent the flexible printed circuit layers.

13. The printed circuit board test fixture of claim 7 wherein the shielding material comprises a polyimide layer having a copper foil laminated to one side thereof, and through holes passing through the copper foil and polyimide layer.

14. The printed circuit board test fixture of claim 7 wherein the first and second through holes are not coated with an electrically conductive trace material.

15. A printed circuit board single plane test fixture comprising:

a well plate having a plurality of first holes passing therethrough;

a plurality of test probe pin assemblies passing through and secured relative to the first holes of the well plate, the test probe pin assemblies being adapted to make electrical contact with test points of a printed circuit board;

a plurality of interface connector pins secured relative to the well plate and extending through an interface alignment panel; said interface alignment panel being adapted to be connected to a test electronics analyzer for sending test signals to the test fixture;

a plurality of flexible printed circuit layers for interconnecting the test probe pin assemblies with the interface connector pins, each of the flexible printed circuit layers including a substrate having circuit traces on at least one side thereof running between first contact apertures for connection with the test probe pin assemblies to secure the substrate layer relative the well plate, and second contact apertures for connection with the interface connector pins to secure the substrate relative to the well plate and the interface alignment panel;

the plurality of flexible printed circuit layers being positioned in spaced apart non-contacting relation from each other such that the test probe pin assemblies and interface connector pins make electrical contact with at least one of a selected one of the plurality of flexible printed circuit layers, and the plurality of flexible printed circuit layers further including non-contact through holes permitting test probe pin assemblies and interface connector pins to pass through selected other layers of the plurality of flexible printed circuit layers without making electrical contact therewith; and, the flexible printed circuit layers each having a thickness in the range of 0.002 to 0.012 inches.

16. The printed circuit board single plane test fixture of claim 15 wherein the flexible printed circuit layers are secured within the test fixture solely by terminal pin connections to the test probe pin assemblies and by terminal pin connections to the interface connector pins.

17. The printed circuit board single plane test fixture of claim 15 further including a layer of shielding material inter-spaced between adjacent layers of the flexible printed circuits.

18. The printed circuit board single plane test fixture of claim 17 wherein the shielding material comprises a polyimide layer having a copper foil laminated to one side thereof, and through holes passing through the copper foil and polyimide layer.

19. The printed circuit board single plane test fixture of claim 15 wherein a plurality of flexible printed circuit layers are employed substantially lying in the same plane.

20. The printed circuit board test fixture of claim 15 wherein the flexible printed circuit layers are secured within the test fixture solely by terminal pin connections to the test probe pin assemblies and the interface connector pins.

21. The printed circuit board test fixture of claim 20 wherein the substrate comprises a polyimide material and each of the first and second contact apertures includes a pattern cut into polyimide material that leaves resilient flaps adapted to grasp respectively the contact probe pin assemblies and the interface connector pins.

22. The printed circuit board test fixture of claim 20 wherein each of the first and second contact apertures includes a conductive adhesive rim for adhering in electrical and mechanical engagement respectively to the test probe pin assemblies and the interface connector pins.

\* \* \* \* \*